United States Patent [19]

Rimkeit et al.

[11] Patent Number: 5,022,083

[45] Date of Patent: * Jun. 4, 1991

[54] APPARATUS AND METHOD FOR COMPENSATING COMPONENT AUDIO SIGNALS

[76] Inventors: Eugene Rimkeit, 4438 SW. Hewett, Portland, Oreg. 97221; Richard Schomburg, Rte. 2, Box 444, Hillsboro, Oreg. 97123

[ * ] Notice: The portion of the term of this patent subsequent to Nov. 15, 2005 has been disclaimed.

[21] Appl. No.: 387,582

[22] Filed: Jul. 27, 1989

Related U.S. Application Data

[63] Continuation-in-part of Ser. No. 229,616, Aug. 8, 1988, Pat. No. 4,955,058, which is a continuation-in-part of Ser. No. 8,617, Jan. 29, 1987, Pat. No. 4,785,475.

[51] Int. Cl.⁵ .............................................. H03G 5/00
[52] U.S. Cl. .................................... 381/98; 333/28 R
[58] Field of Search ................ 381/98, 103; 333/28 T, 333/28 R

[56] References Cited

U.S. PATENT DOCUMENTS

| | | | |
|---|---|---|---|
| 4,297,933 | 11/1981 | Nishimoto | 84/622 |
| 4,661,982 | 4/1987 | Kitazato et al. | 381/98 |
| 4,682,526 | 7/1987 | Hall et al. | 84/622 |
| 4,785,475 | 11/1988 | Rimkeit et al. | 381/98 |

Primary Examiner—Forester W. Isen
Attorney, Agent, or Firm—Dellett, Smith-Hill and Bedell

[57] ABSTRACT

Apparatus for compensating component audio signals comprises amplifier means and a gain control circuit for selectively adjusting the gain of the amplifier means in response to data values received by the gain control circuit. The apparatus has power supply terminals for supplying operating current from an external power source to the amplifier and the gain control circuit. In addition, the apparatus comprises an electronic storage device for storing data values and applying those data values to the gain control circuit. The stored data values are maintained in the apparatus upon interruption of the supply of operating current to the power supply terminals. The apparatus has an input port for applying data values to the storage device, and does not have manually actuable controls for selectively adjusting the stored data values.

30 Claims, 8 Drawing Sheets

APPARATUS AND METHOD FOR COMPENSATING COMPONENT AUDIO SIGNALS

CROSS-REFERENCE TO RELATED APPLICATION

This is a continuation-in-part of co-pending patent application Ser. No. 07/229,616 filed Aug. 8, 1988, now U.S. Pat. No. 4,955,058, which is in turn a continuation-in-part of patent application Ser. No. 07/008,617 filed Jan. 29, 1987, now U.S. Pat. No. 4,785,475.

BACKGROUND OF THE INVENTION

This invention relates to an apparatus and method for compensating component audio signals.

One example of compensating component audio signals is equalizing a soundfield. As used herein, the term "soundfield" means an environment in which an audio frequency signal is propagated in electrical form from a signal source to an electroacoustic transducer and is propagated in acoustic form to a receiver. The source of the audio frequency electrical signal may be, for example, a microphone, the cartridge of a phonograph, the tuner of an FM or AM radio or the playback head of a tape player. The electroacoustic transducer may be a loudspeaker, and the receiver may be an acoustoelectric transducer or the human auditory system. Even when the receiver is an acoustoelectric transducer, for converting the audio frequency acoustic signal to electrical form, the signal will normally be applied eventually to the auditory system of a human listener. Thus, as used herein the term "soundfield" is not limited to an environment in which actors, singers or musicians generate vocal or musical sounds to be heard immediately by, or recorded for subsequent playback to, other persons, but applies also to, for example, an environment provided with a public address system, such as an airport terminal building, and a room having a sound amplification system, such as a courtroom.

The auditory sensation received by a person listening (either directly or indirectly) to the sound emitted by the electroacoustic transducer depends not only on the signal provided by the source of the audio frequency electrical signal but also on the frequency response of the signal propagation path from the signal source to the receiver. The frequency response of the propagation path defines the relationship between the amplitude of a signal component generated at the source and the amplitude of that same signal component provided at the receiver, as a function of the frequency of the signal component. If the frequency response of the propagation path is not uniform, the relative amplitudes of the signal components at different frequencies are altered during propagation from the signal source to the receiver.

Generally, the frequency response of a signal propagation path is not uniform, and it is conventional to compensate for the non-uniformity in the frequency response of the propagation path from the signal source to the receiver by including an equalizer in the propagation path. An equalizer is an amplifier of which the frequency response is selectively variable. In general, if, in the absence of the equalizer, a signal component at a given frequency is attenuated in the propagation path to a greater degree than are signal components at other frequencies, the frequency response of the equalizer is adjusted so that the gain of the amplifier is greater at the given frequency than at other frequencies.

As shown in FIG. 1, a known form of an equalizer 2 comprises an operational amplifier 4 having a non-inverting input terminal which receives the signal from a signal source 6 by way of an audio amplifier 8. The amplifier 4 has an output terminal which is connected through a resistor 10 to an output node 12 which is in turn connected through a power amplifier (not shown) to a loudspeaker 14. A feedback resistor 16 is connected between the output terminal of the amplifier 4 and its inverting input terminal 17. The equalizer also comprises a bank of n resonators $18i$ ($i = 1 \ldots n$) of selected center frequencies fi. A variable resistor $20i$ is connected between each resonator and an associated switch $22i$. In a first position of the switch $22i$, the series combination of the resistor $20i$ and the resonator $18i$ is connected between the terminal 17 and ground, and in a second position of the switch $22i$ the series combination is connected between the node 12 and ground. Ignoring the effect of the other resonators and resistors, when the switch $22_1$ associated with the resonator $18_1$ having the center frequency $f_1$ is in the first position, the gain $A_{v1}$ at the frequency $f_1$ is given by $$A_{v1} = 1 + \frac{R16_1}{R20_1 + Z_1}$$

where R16 is the resistance of the resistor $16_1$, $R20_1$ is the resistance of the variable resistor $20_1$ and $Z_1$ is the impedance of the resonator $18_1$ at the frequency $f_1$ When the value of $R20_1$ is infinite, $A_{v1}$ is equal to unity.

When the switch 22 is in its second position, the gain $A_{v1}$ is one and the amplitude of the signal applied to the loudspeaker 14 at the frequency $f_1$ depends on the potential divider effect of the resistor 10 and the series combination of the resistor $20_1$ and the resonator $18_1$. The signal applied to the loudspeaker 14 at the frequency $f_1$ is attenuated by a factor $$(R20_1 + Z_1)/(R10 + R20_1 + Z_1)$$

with respect to the signal at the output terminal of the amplifier 2. By appropriate selection of the values of the resistors $20i$ and the settings of the switches $22i$, a frequency response curve can be established such that at certain frequencies the overall gain of the propagation path, including the equalizer, is unity, at other frequencies it is greater than unity and at still other frequencies it is less than unity.

The resonators 18 may each comprise a series combination of a resistor, an inductor and a capacitor. The impedance of the resonator is adjustable by varying the resistance value of the resistor. The resonators may be of constant Q (the value of Q is independent of the resistance value of the resistor) or of variable Q (the value of Q depends on the resistance value of the resistor).

In a conventional equalizer, the positions of the switches and the values of the variable resistors are adjusted through slide controls on a useraccessible front panel of the equalizer. The settings allow the user of the equalizer to determine at a glance the configuration of the frequency response curve of the equalizer, and also allow the user to set the curve to a desired configuration, i.e., boosting certain frequencies and cutting other frequencies. This feature of the conventional equalizer is, however, subject to misuse, particularly when the soundfield requires the services of a skilled audio technician to achieve satisfactory equalization, since an unskilled person can adjust the settings of the slide controls as easily as can a skilled technician, with the result that the equalization achieved by the technician is lost and cannot be recreated without expenditure of substantial effort.

The National Semiconductor LMC835 integrated circuit is a programmable resistor network suitable for use in conjunction with an operational amplifier and a bank of fourteen resonators to provide an equalizer. As shown in FIG. 2, the LMC835 comprises multiple resistors 30 connected in series with respective switches 34. The resistors are arranged in fourteen groups of twelve, which are connected to the resonators 18 respectively. Only one of the fourteen groups of resistors is shown in FIG. 2. Each group of twelve resistors is divided into a boost network 38 and a cut network 42. In the boost mode, all the switches connected to the resistors of the cut network 42 are non-conductive and therefore the cut network is out of circuit. One or more of the switches connected to the resistors of the boost network are conductive, and the resonator 18 is connected in series with the boost network (of which the resistance depends on which of the switches 34 are conductive) between the inverting terminal 17 of the amplifier 4 and ground. In the cut mode, all the switches connected to the resistors of the boost network 38 are non-conductive and one or more of the switches connected to the resistors of the cut network 42 are conductive.

The permitted states of the switches 34 allow twelve different boost settings, twelve different cut settings and a neutral, or unity gain setting. The states of the switches are controlled by serial data applied to the integrated circuit by way of a serial data port having data, clock and strobe lines, and a serial-to-parallel register 46. The serial data is applied to the register 46 in a succession of data sets, each of which comprises band selection data and gain selection data. The state of the data line is read on successive clock pulses, and a strobe pulse signifies the end of a data set. The strobe pulse causes the preceding data set to be latched. The band selection data is latched into a latch 48 and is decoded by a decoder 50 to select one of the fourteen banks of twelve resistors, and the gain selection data is latched into a latch 52 and is applied to a selector circuit 54. The circuit 54 responds to the gain selection data by causing selected switches 34 to be rendered conductive. Hitherto, it has been conventional to supply the serial data to the LMC835 integrated circuit by use of front panel controls on the equalizer. For example, as shown in FIG. 3, the equalizer might be provided with a cut switch 56 and a boost switch 58 for each group of resistors. On momentarily closing one of the switches of the pair, e.g. the cut switch 56, a microcomputer 60 generates a data set which is applied to the LMC835 circuit 64. The band selection data of the data set identifies the group of resistors of the circuit 64 that is associated with one of the resonators 18, and the gain selection data causes switches 34 of the circuit 64 to be closed such that the gain of the equalizer at the frequency associated with the selected group of resistors is reduced by one step.

A disadvantage of the LMC835 integrated circuit is that on loss of operating power for the equalizer, due to switching off of the equalizer or to interruption of the utility service supply, the gain settings are lost. In order to allow the frequency response curve to be recreated, an equalizer employing the LMC835 integrated circuit may include an LED bar graph display 62 which is driven by the signals provided by the microcomputer and provides a visible indication of the shape of the frequency response curve of the equalizer. After interruption of the power supply, the user of the equalizer can adjust the boost and cut switches to recreate the frequency response curve previously shown by the bar graph display, provided of course that the shape of the curve is known.

Another example of compensating component audio signals is mixing audio signals from different sources. FIG. 7 is a block diagram of an audio mixer based on known principles. Mixer 156 has six identical input channels which receive audio signals from respective audio signal sources 152A-152F. Each source 152 might be, for example, a microphone, the cartridge of a phonograph, or the playback head of a tape recorder. The signal provided by source 152A is amplified by an audio amplifier 154A. The output signal of amplifier 154A is applied to an input attenuator 170A which provides a signal of which the amplitude represents the product of the amplitude of the input signal and the attenuation setting of the attenuator. Input attenuator 170A is illustrated as a voltage divider comprising a fixed resistor 184A, a variable resistor 186A and a scaling resistor 187 connected in series between the output terminal of amplifier 154A and ground, with the output signal of attenuator 170A being taken from the connection point of the resistors 184A and 186A through an operational amplifier 188A. The output signal of attenuator 170A is summed in a summing circuit 174 with output signals of the other input attenuators 170B-170F, and summing circuit 174 outputs a single audio signal to an output attenuator 178. Output attenuator 178 is similar to input attenuator 170A and provides an output signal that is a function of the attenuation setting of attenuator 178. The signal provided by attenuator 178 is applied through an operational amplifier to an output amplifier 158. The output amplifier 158 is connected to an equalizer (not shown) whereby the frequency response of the audio signal is adjusted and then the resultant signal drives a loudspeaker (not shown) through a power amplifier (not shown).

Referring again to FIG. 2, the fourteen groups of resistors of the LMC835 circuit are in two sets, which may be designated set A and set B, and all the cut networks of set A are connected to a single pin of the circuit. Similarly, all the boost networks of set A are connected to a second pin, all the cut networks of set B are connected to a third pin, and all the boost networks of set B are connected to a fourth pin. Referring to FIG. 7, the variable resistors 186 of the attenuators are implemented using LMC835 circuits 150-153 operating under control of a microcomputer 168. In the mixer shown in FIG. 7, the variable resistor 186 of input attenuator 170A is implemented by the cut network of one of the seven groups of resistors in set A of LMC835 circuit 150. The variable resistor of the input attenuator 170B is implemented by the cut network of one of the seven groups of resistors in set B of circuit 150. Circuits 151 and 152 are connected, in similar fashion to circuit 150, as variable resistors of the other input attenuators, and the cut network of one of the seven groups of resistors in set A of circuit 153 provides the variable resistor of the output attenuator. The seven groups of resistors in set B of circuit 153 are unused. The mixer shown in FIG. 7 has a user interface 162. User interface 162 includes a cut switch 164 and a boost switch 166 for each of the six input channels A-F and for the output attenuator. The cut and boost switches are actuated by buttons on the user interface. User interface 162 operates in similar fashion to the user interface shown in FIG. 3. In response to the closing of a cut or boost switch of the user interface, microcomputer 168 generates a data set which is applied to circuits 150-153. Each data set includes not only band selection data and gain selection data but also chip selection data, for selecting which of the LMC835 circuits is to be adjusted in response to the band and gain selection data of that data set. The chip selection function may alternatively be accomplished by a decoder (not shown) which applies the band and gain selection data to only one selected LMC835 circuit.

If, for example, user interface 164 selects channel A, circuit 150 receives the channel selection data and gain selection data from microcomputer 168. The channel selection data selects the group of resistors whose cut network implements variable resistor 186A, and the gain selection data selects a resistance value for the cut network of the selected group such that the output signal of amplifier 188A has the desired amplitude relative to the signal provided by amplifier 154A. The output signal of amplifier 188A is applied to summing circuit 174. When the mixer is powered up, microcomputer 168 provides data sets such that the other six groups of resistors in each of sets A and B are all in the neutral, or unity gain, mode, and therefore have no effect on the output signal provided by attenuator 170A.

Similarly, if user interface 164 selects output attenuator 178, circuit 153 receives the channel selection data and gain selection data from microcomputer 168. The channel selection data selects the group of resistors that implements the variable resistor of attenuator 178, and the gain selection data selects an appropriate resistance value for the cut network of the selected group.

The controls of a conventional mixer may be similar to those of an equalizer, and allow the user to determine at a glance the relative contributions of the input signals to the output signal. However, the conventional mixer is subject to the same disadvantage as the conventional equalizer with regard to adjustment by an unskilled person.

Prior to Jan. 29, 1986 a computer-controlled mixer had been publicly used. This mixer has multiple input channels receiving audio signals from respective sources, a summation circuit and an output channel. The gain of each input channel and of the output channel is controlled by means of a general-purpose digital computer. The mixer may be used in a sound studio, where a sound engineer dynamically controls the gain setting of each input channel to achieve a desired aural impression. However, the mixer cannot be used as a stand-alone unit, since the gain settings supplied to the input channels are not stored in nonvolatile memory and are lost when the computer is disconnected from the mixer.

SUMMARY OF THE INVENTION

A preferred embodiment of the present invention in its first aspect comprises apparatus for compensating a plurality of component audio signals. The apparatus comprises amplifier means and a gain control circuit for selectively adjusting the gain of the amplifier means in response to data values received by the gain control circuit. The apparatus has power supply terminals for supplying operating current from an external power source to the amplifier and the gain control circuit. In addition, the apparatus comprises an electronic storage device for storing data values and applying those data values to the gain control circuit. The stored data values are maintained in the apparatus upon interruption of the supply of operating current to the power supply terminals. The apparatus has an input port for applying data values to the storage device, and does not have controls that can be manually actuated for selectively adjusting the stored data values.

In accordance with a second aspect of the invention, a plurality of component audio signals are compensated using apparatus which comprises a first component and a second component. The first component comprises amplifier means, a gain control circuit for selectively adjusting the gain of the amplifier means in response to data values received by the gain control circuit, a storage device for storing data values, and an input port for receiving an electrical signal which is coded in accordance with selected data values for applying the data values to the storage device. The second component comprises a device for generating an electrical signal which is coded in accordance with selected data values and an output port for making the electrical signal available at the exterior of the second component. The output port of the second component is connected to the input port of the first component and the second component is used to apply an electrical signal which is coded in accordance with selected data values to the input port of the first component, whereby the selected data values are stored in the storage device of the first component. The second component is thereafter disconnected from the first component.

Preferably, the storage device is a non-volatile random-access memory having several separately addressable memory locations in which different sets of data values can be stored. Any one of the sets of data values can be selected by the user by operating appropriate front panel controls.

BRIEF DESCRIPTION OF THE DRAWINGS

For a better understanding of the invention, and to show how the same may be carried into affect, reference will now be made, by way of example, to the accompanying drawings in which.

The detailed description that follows is addressed to persons skilled in the art. Therefore, matters of routine circuit design, such as timing and interfacing requirements, and other matters that do not contribute to an understanding of the invention are not described.

DETAILED DESCRIPTION

Figure 1:
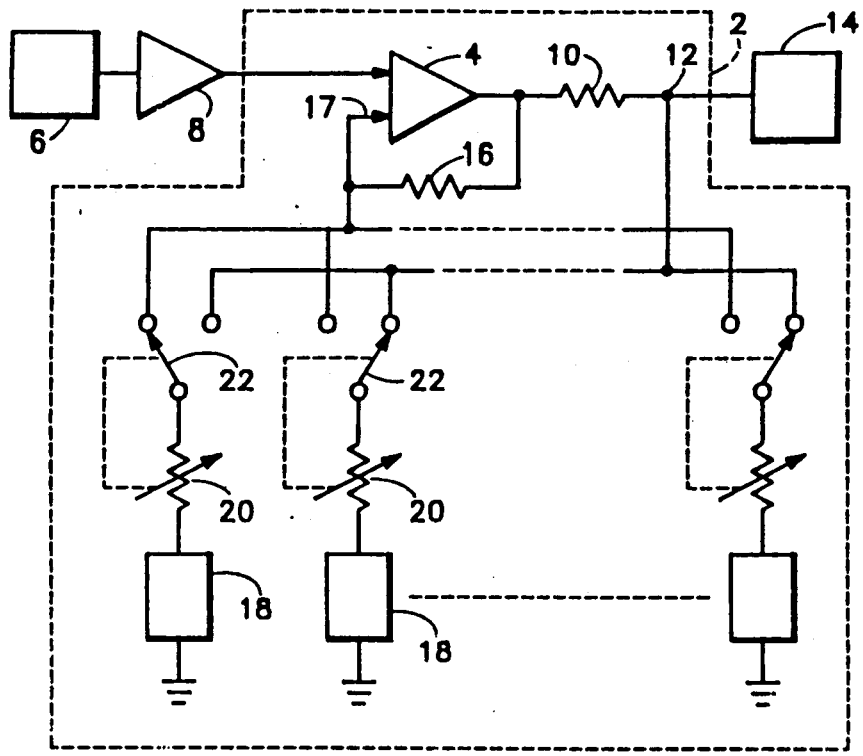
FIG. 1 is a block diagram of a conventional audio system including an equalizer.
Figure 4:
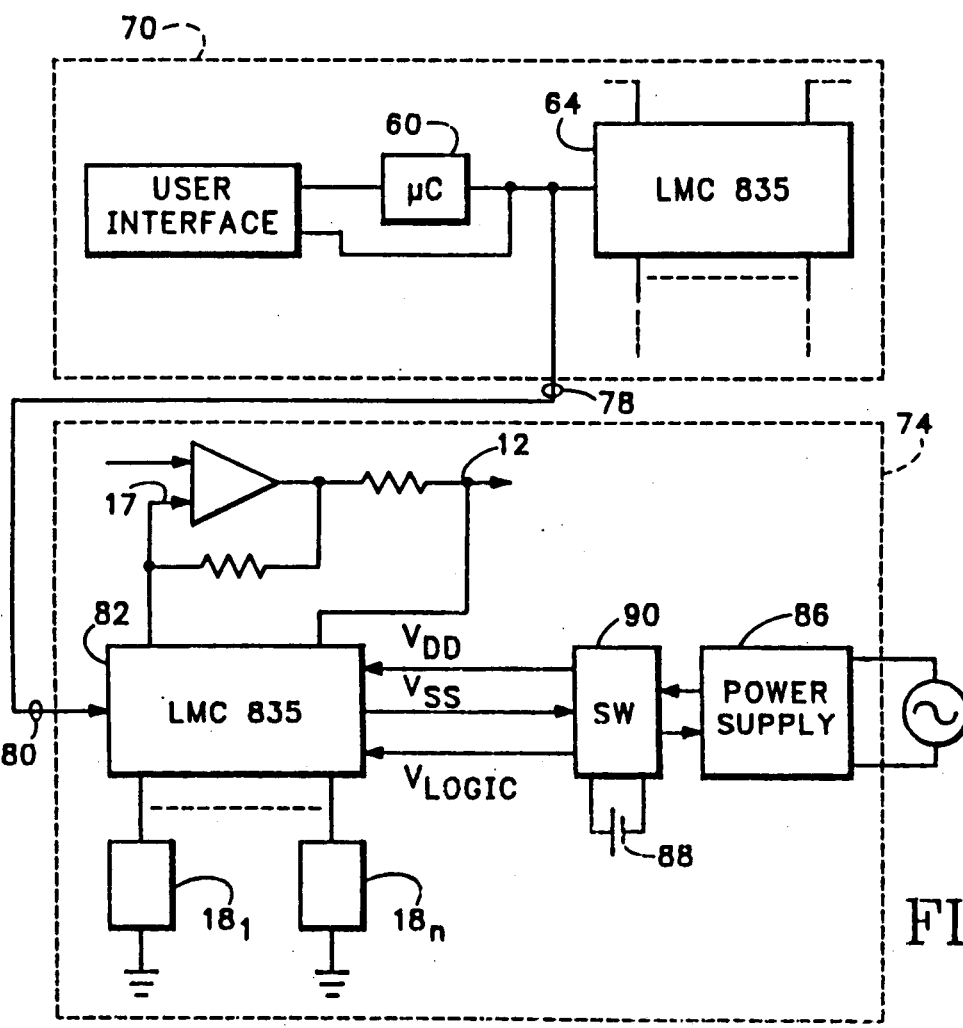
FIG. 4 is a partly schematic diagram of a first equalization system embodying the present invention.
Figure 2:
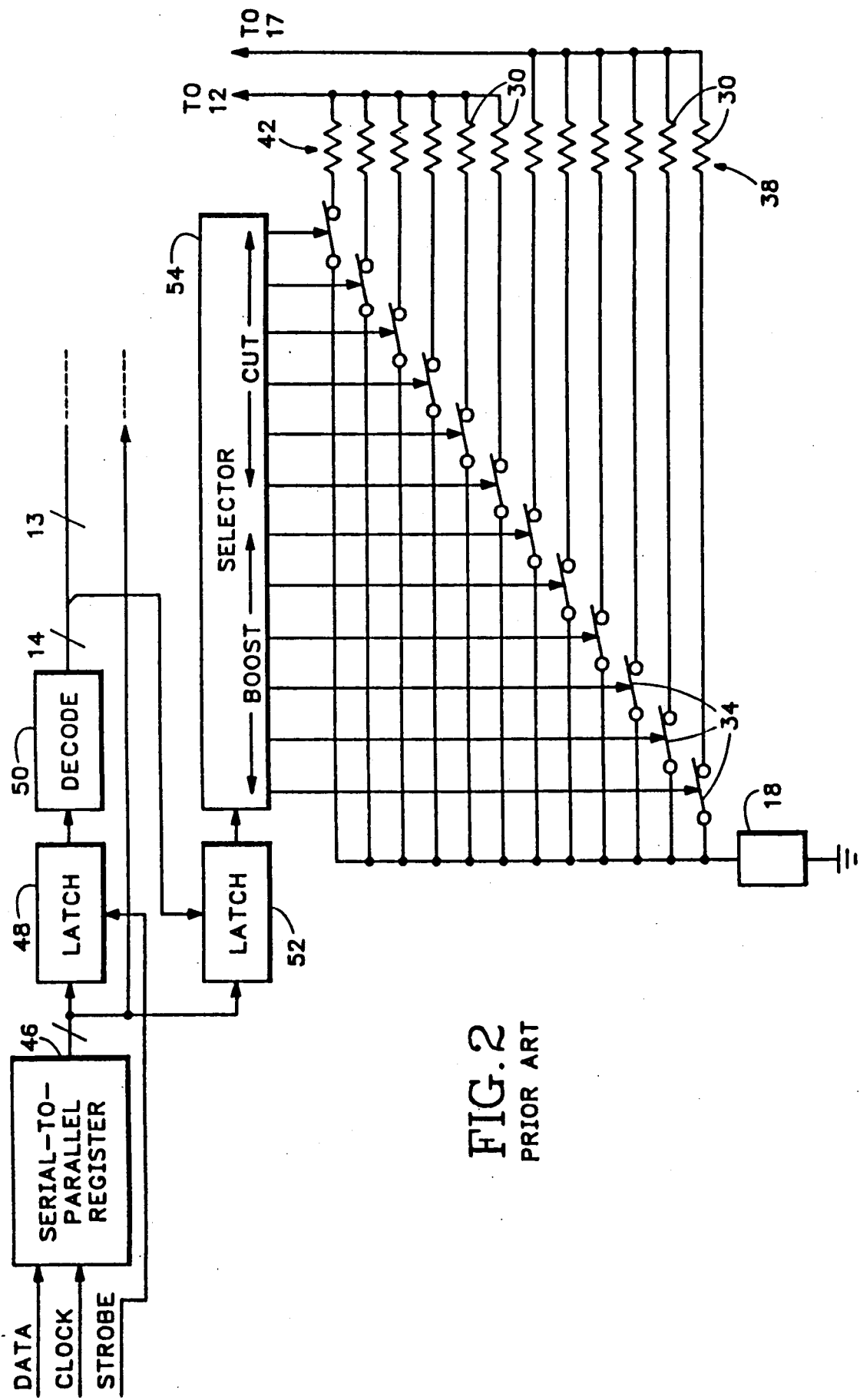
FIG. 2 is a partly schematic diagram of a portion of the National Semiconductor LMC835 integrated circuit.
Figure 3:
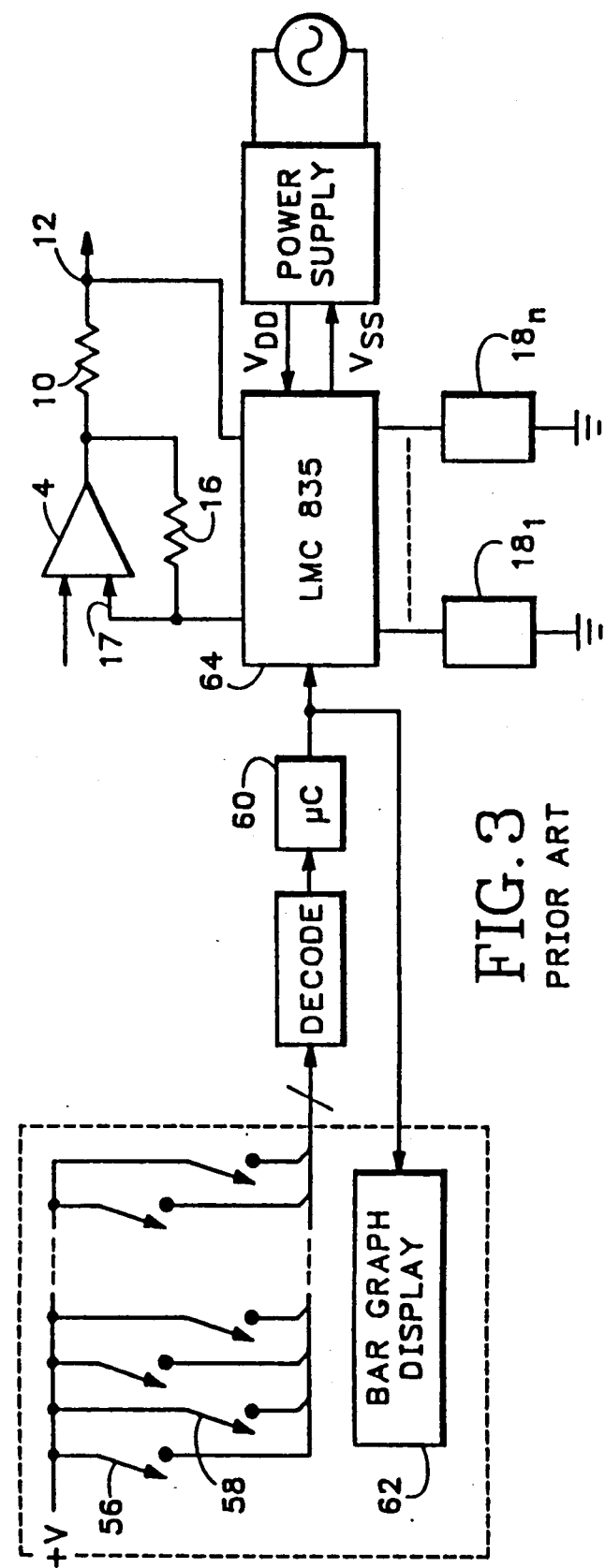
FIG. 3 is a block diagram of an equalizer incorporating the LMC835 integrated circuit.

The equalization system shown in FIG. 4 comprises a master equalizer 70 and a slave equalizer 74. The master equalizer is of the general form illustrated in FIG. 3, except that it has an output port 78 at which the serial data that is provided to the LMC835 circuit 64 is made available at the exterior of the equalizer.

The slave equalizer 74 does not have any front panel controls similar to the user interface of the master equalizer, but it has an input port 80 at which it receives the serial data provided at the output port 78 of the master equalizer 70. The serial data received by way of the input port 80 is applied to an LMC835 circuit 82. In carrying out an equalization, the master equalizer is out of the audio signal path and is used as a terminal for supplying the slave equalizer with serial data to establish the desired frequency response curve of the slave equalizer. Once equalization has been achieved, the master equalizer is disconnected from the slave equalizer, and accordingly the equalization curve cannot be adjusted manually unless access can be had to another terminal.

The slave equalizer includes a power supply circuit 86 which receives alternating current from the utility service supply and provides operating current to the various components of the master equalizer. In particular, the power supply circuit provides positive and negative DC voltages to the circuit 82 by way of the $V_{dd}$ and $V_{ss}$ pins of the circuit.

It will be understood that so long as the power supply circuit provides operating current to the circuit 82 of the slave equalizer, the serial data received from the master equalizer is stored in the latch circuits (not shown in FIG. 4) of the slave equalizer when the master equalizer is disconnected from the slave equalizer. In order to protect the slave equalizer against loss of this data in the event that there is an interruption in supply of operating current from the utility service supply to the slave equalizer, the slave equalizer includes an auxiliary battery-driven power supply circuit 88. A voltage sensitive switch 90 prevents discharge of the battery when the power supply circuit 86 provides operating current, but on interruption of the utility service supply the switch 90 immediately connects the auxiliary power supply circuit 88 to the circuit 82. The circuit 88 provides sufficient current to maintain the circuit 82 in operating condition, i.e., without loss of data stored in the latch and select circuits, when supply of current from the power supply circuit 86 is interrupted, so that when power is restored the frequency response curve of the slave equalizer will be the same as it was before loss of power.

Figure 5:
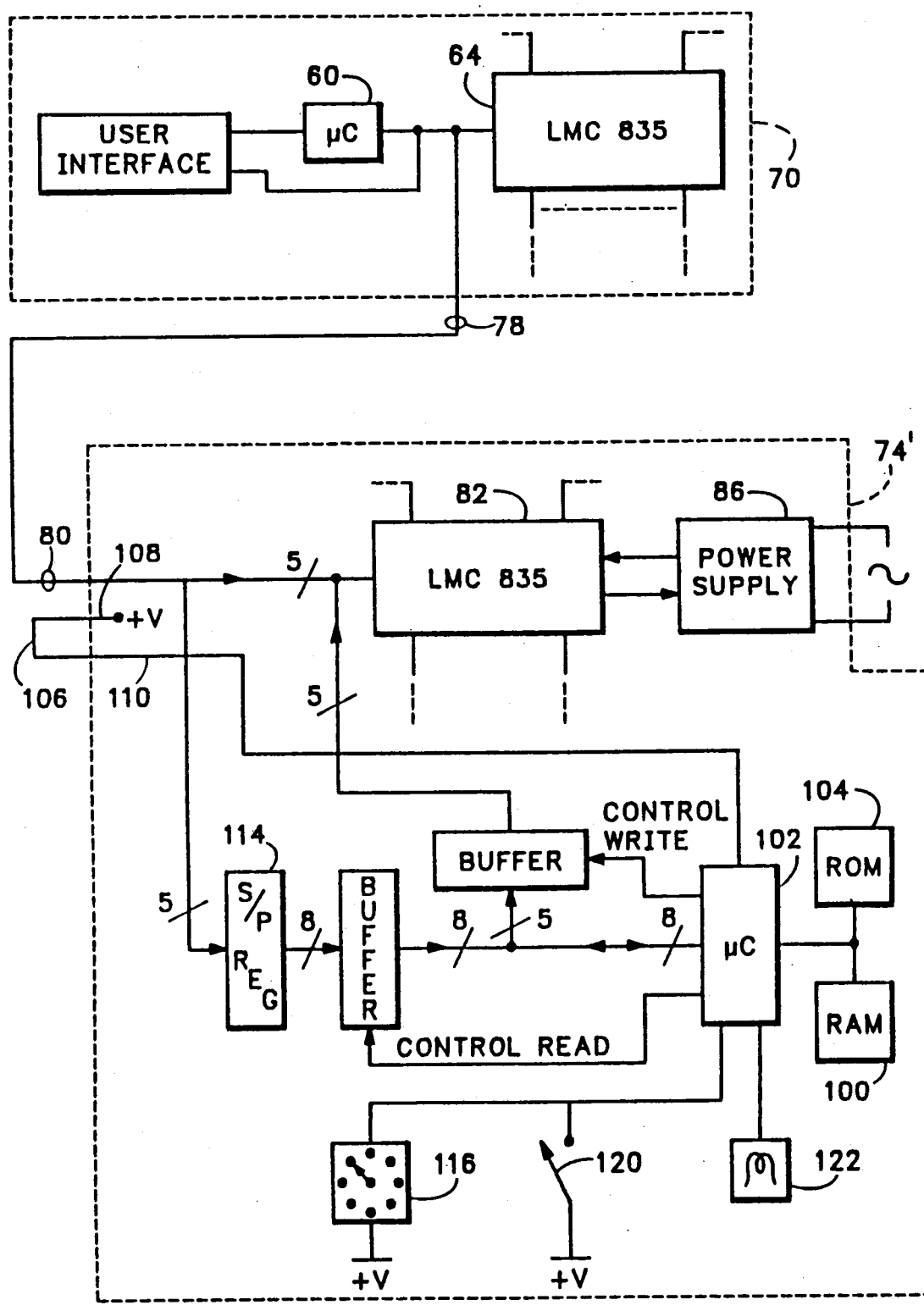
FIG. 5 is a partly schematic diagram of a second equalization system embodying the present invention.
Figure 6:
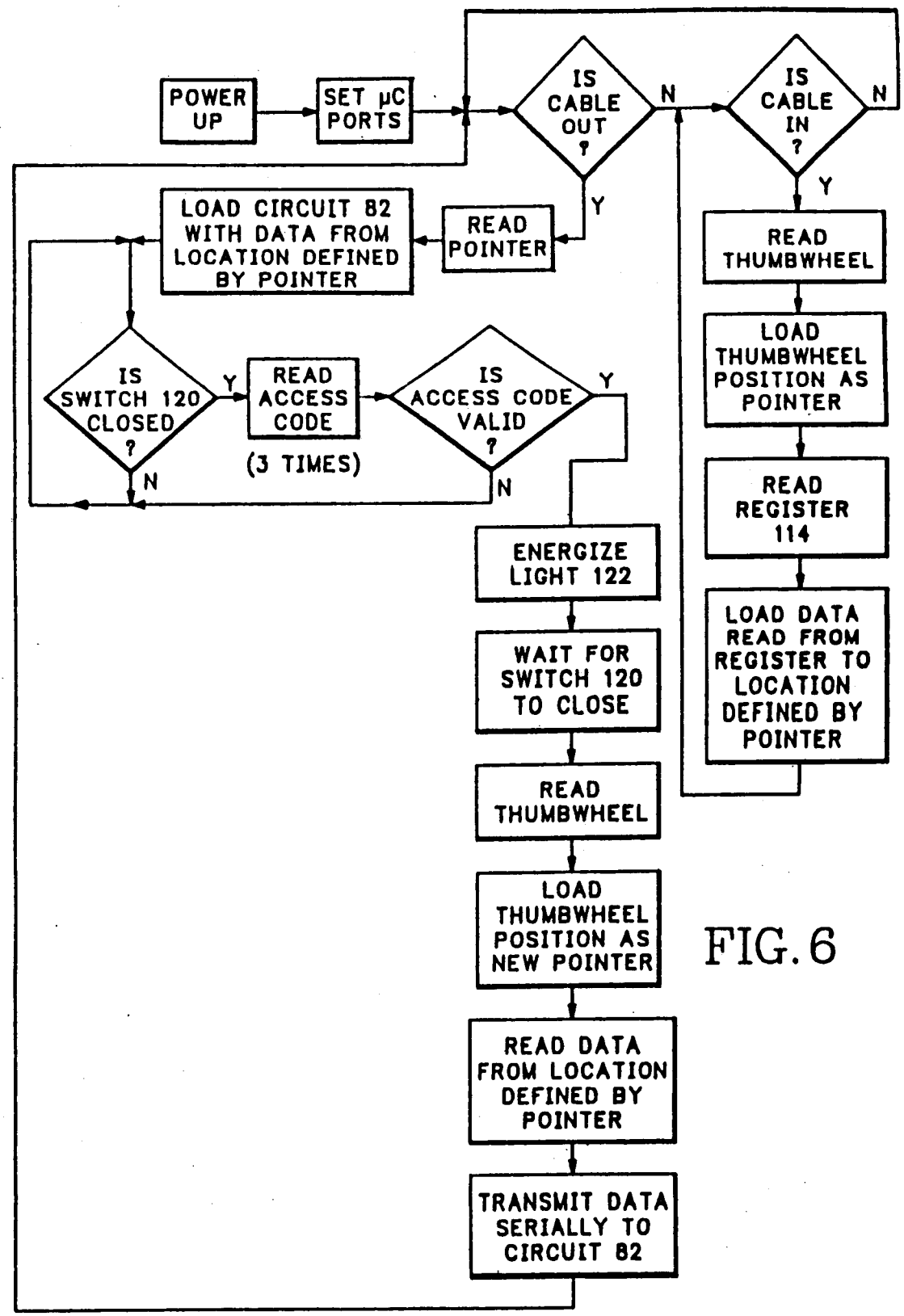
FIG. 6 is a flowchart illustrating the operation of the FIG. 5 equalizer.

The slave equalizer 74' shown in FIG. 5 is similar to the slave equalizer 74 shown in FIG. 4, except that it does not include an auxiliary power supply circuit for maintaining the circuit 90 in operating condition but instead includes a nonvolatile random-access memory (RAM) 100 and a microcomputer 102 for controlling writing of data received at the input port 80 to the memory 100 and reading of data from the memory 100 to the latch and select circuits of the slave equalizer. The data written into the RAM, which may be a commercially available hybrid circuit including a lithium cell, is preserved upon loss of normal operating power for the equalizer. The microcomputer 102 operates under control of a program stored in a read-only memory (ROM) 104. The operations performed by the microcomputer are illustrated in the flowchart shown in FIG. 6.

The cable for connecting the output port 78 of the master equalizer to the input port 80 of the slave equalizer includes not only the conductors for supplying data, clock and strobe signals to the circuit 82 of the slave equalizer, but also a jumper 106 which is connected to additional pins of the plug used for connecting the cable to the input port. These additional pins mate with terminals 108 and 110 of the input port, and these terminals are accordingly shorted by the jumper 106. In normal operation, the microcomputer 102 repeatedly polls the state of the pin 110. If the pin 110 is at the potential of the pin 108, this implies that the master equalizer is connected to the slave equalizer and therefore that the user wishes to load data into the slave equalizer and have it stored in the memory 100. The microcomputer 60 of the master equalizer generates a data set which is provided to the slave equalizer by way of the input port 80. The data set is latched into the circuit 82, in the manner described previously, and is also loaded into a serial-to-parallel register 114. The strobe pulse provided by the microcomputer 60 for latching the set into the circuit 82 is treated as an interrupt by the microcomputer 102, and accordingly the microcomputer 102 enters an interrupt service routine. The microcomputer 102 services the interrupt by reading the data set stored in the register 114 and writing it into the memory 100. The sequence of latching the data sets into the circuit 82 and loading them into the RAM 100 is continued until all the data sets required to define a desired frequency response curve have been transferred from the master equalizer to the slave equalizer.

The memory 100 has eight storage locations each able to store all the data sets required to define a frequency response curve for the slave equalizer. The storage location into which the data sets defining a new frequency response curve are written is defined by a pointer provided by an eight-position thumbwheel switch 116, the position of which in the range from 1 to 8 is read by the microcomputer 102. The memory 100 also has a ninth storage location in which it stores the pointer currently provided by the thumbwheel switch. When the data sets defining a frequency response curve are written into one of the first eight storage locations, the data sets defining the curve (if any) that was previously stored at that location are erased from the memory.

When the data sets defining a new frequency response curve have been loaded into the memory 100, switch 116 is advanced to designate the next location into which the next series of data sets is to be written. When data sets defining all the desired frequency response curves have been applied to the port 80, the slave equalizer is disconnected from the master equalizer by removing the plug from the input port 80. Upon detecting that the pin 110 is no longer at the same potential as the pin 108, implying that the master equalizer is no longer connected to the slave equalizer, the microcomputer 102 enters a select routine.

In the select routine, the microcomputer 102 reads the pointer from the memory 100. After a short delay to ensure that the circuit 82 is functioning, the microcomputer 102 enters an old curve subroutine. In the old curve subroutine, the microcomputer 102 uses the pointer as an address for reading data sets from the memory and loading them into the circuit 82. In this manner, the data sets that were most recently received from the master equalizer are loaded into the circuit 82. These data sets are already present in the circuit 82 due to their having been loaded both into the circuit 52 and into the memory 100 and therefore the state of the circuit 82 is unchanged.

In the select routine, the microcomputer 102 also polls the state of the thumbwheel switch 116 and a two-position switch 120. If the switch 120 is closed, it implies that an attempt is being made to enter an access code which will enable the user to select a frequency response curve other than the one designated by the thumbwheel switch at the time of entering the select routine. If the switch 120 is found to be closed, the microcomputer does not read data sets from the memory but enters a new curve subroutine. In the new curve subroutine, the microcomputer first determines whether a valid access code has been entered. The access code is stored in the ROM 104. For example, the access code might be 123, and in order to enter this code the user turns the thumbwheel to position 1 and closes the switch 120, turns the thumb wheel to the position 2 and closes the switch 120 and turns the thumbwheel to the position 3 and closes the switch 120. On detecting that a valid access code has been entered, the microcomputer 102 causes a front panel light 122 to be energized. The user can then select one of the stored frequency response curves, for example the curve 4, by turning the thumbwheel to the position 4 and closing the switch 120. The pointer for position 4 of the thumbwheel switch is entered in the memory 100, and the microcomputer then reads the data defining frequency response curve 4 from the RAM 100 and applies this data to the circuit 82 by way of the buffer 84.

In the event that the microcomputer 102 enters the new curve subroutine but entry of a valid access code is not detected by the microcomputer, the microcomputer enters the old curve subroutine.

If there is an interruption in the utility service supply, the data sets stored in the latches of the circuit 82 are dissipated. However, the data sets defining the eight frequency response curves to have been loaded in the slave equalizer remain stored in the non-volatile memory 100, together with the pointer defining the location in the memory of the data sets that were most recently loaded into the circuit 82. On power up, i.e., when the microcomputer 102 receives operating current after having been deprived of operating current, the microcomputer polls the state of the pin 110 and if the pin 110 is not at the same potential as the pin 108 the microcomputer enters the select routine. Provided a valid access code is not entered, the result of entering the select routine is that the data sets that were most recently loaded into the circuit 82 are once again loaded into that circuit and the slave equalizer then operates with the same frequency response curve as it had prior to interruption of the utility service supply. If, on power up, the pin 110 is at the same potential as the pin 108, the microcomputer 102 waits to receive data sets by way of the input port 82.

Figure 7:
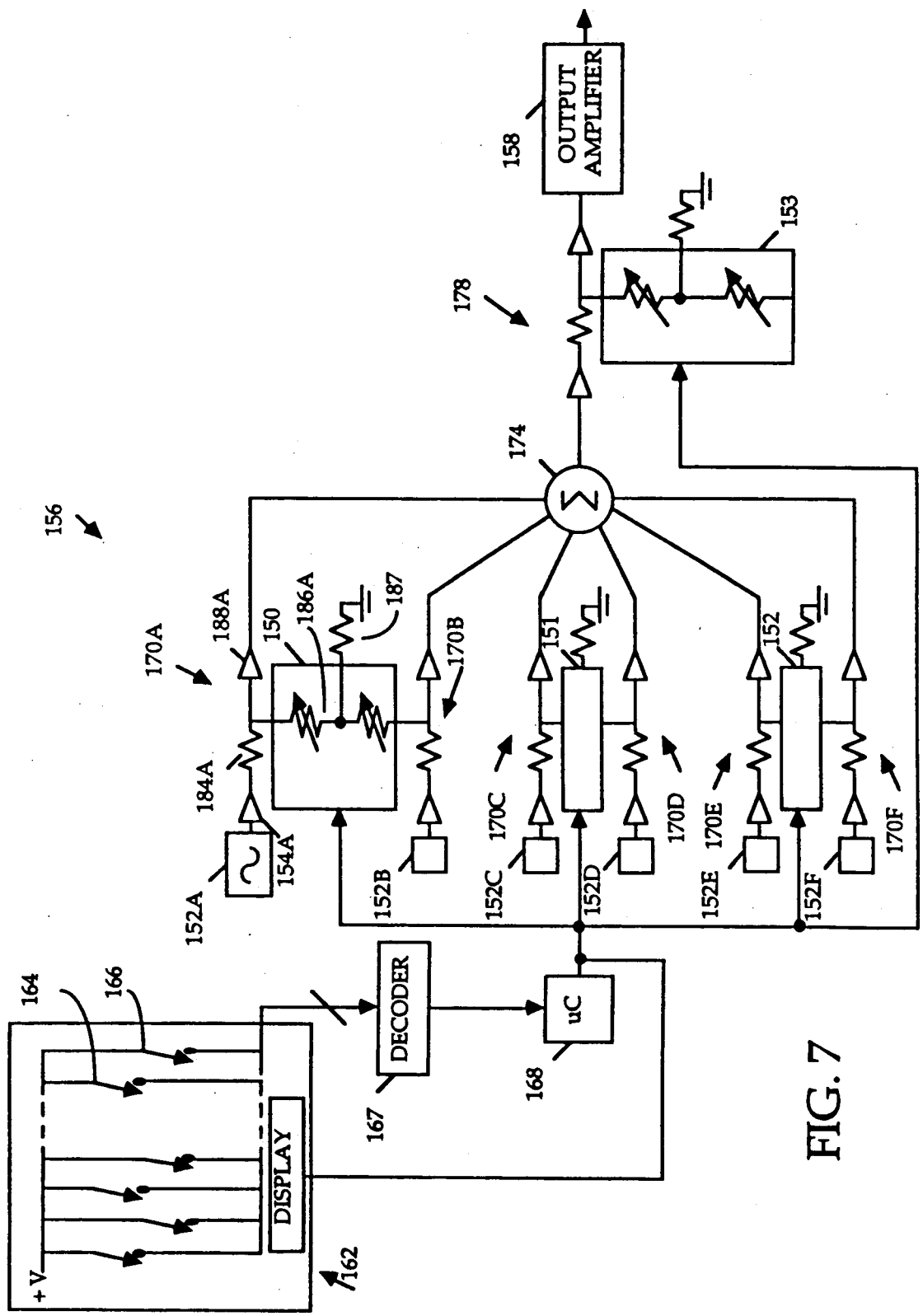
FIG. 7 is a block diagram of an audio system including a mixer.
Figure 8:
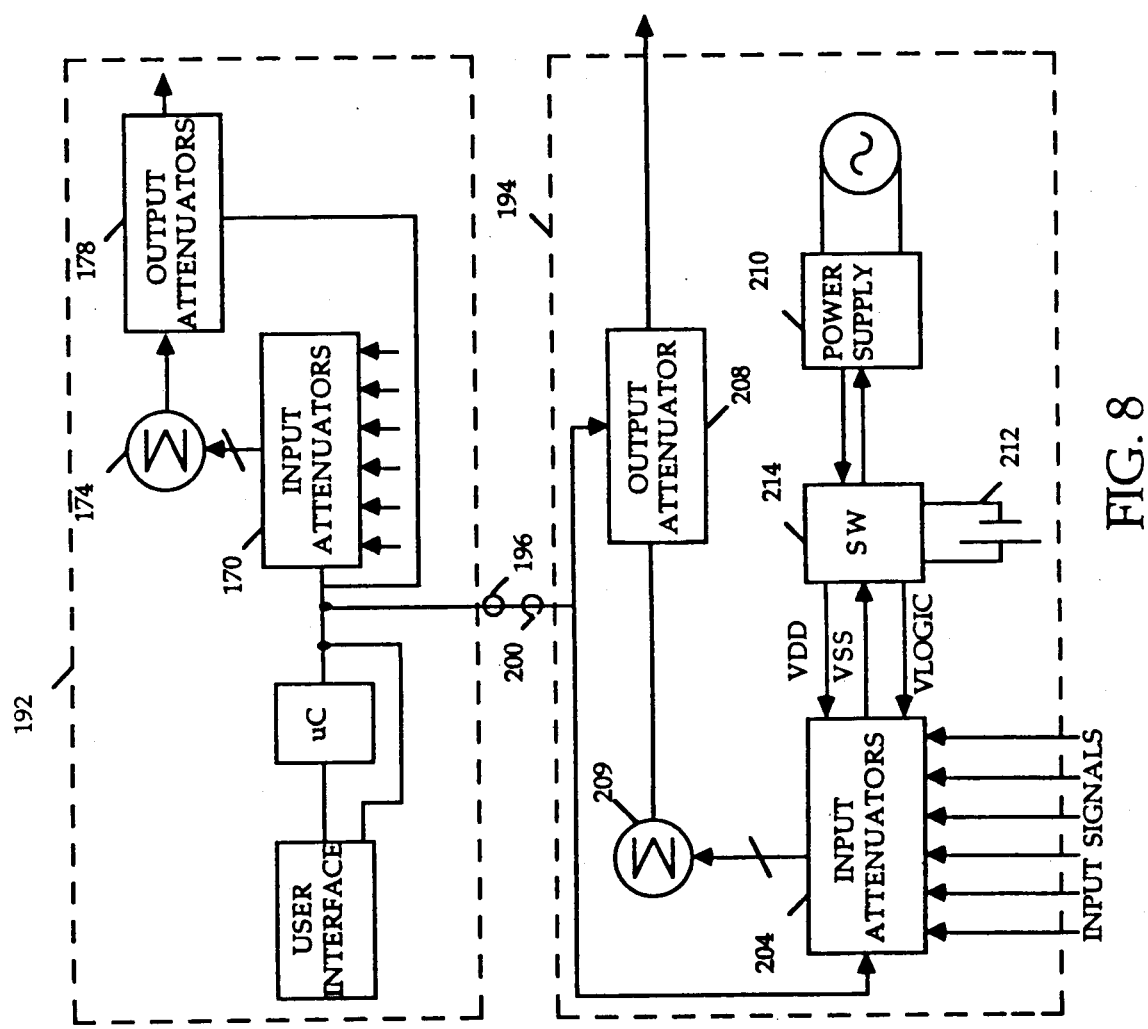
FIG. 8 is a block diagram of a mixer incorporating the LMC835 integrated circuit.

The mixing system shown in FIG. 8 comprises a master mixer 192 and a slave mixer 194. The master and slave mixers are each of the general form illustrated in FIG. 7, except that the slave mixer does not have any front panel controls similar to the user interface of the master mixer. The master mixer has an output port 196 at which the serial data that is provided to input attenuators 170 and output attenuator 178 is made available at the exterior of the mixer and the slave mixer 194 has an input port 200 at which it receives the serial data provided at output port 196 of the master mixer 192. The serial data received by way of the input port 200 is applied to input attenuators 204 and output attenuator 208 in the manner described with reference to FIG. 7. The audio signal input and output terminals of master mixer 192 are not electrically connected to any other components, and therefore master mixer 192 is out of the audio signal path. Master mixer 192 is used as a terminal for supplying the slave mixer with serial data to establish the desired attenuation for each attenuator of the slave mixer. Once the desired attenuation setting has been achieved for each attenuator of the slave mixer, the master mixer is disconnected from the slave mixer, and accordingly the attenuation settings cannot be adjusted manually without reconnecting the slave mixer to a master mixer.

The slave mixer includes a power supply circuit 210 which receives alternating current from the utility service supply and provides operating current to the various components of the slave mixer. In particular, the power supply circuit provides positive and negative DC voltages to the LMC835 circuits of input attenuators 204 and output attenuator 208 by way of the $V_{dd}$ and $V_{ss}$ pins of those circuits.

It will be understood that when the master mixer is disconnected from the slave mixer, the serial data received from the master mixer is stored in the latch circuits (not shown in FIG. 8) of the slave mixer so long as the power supply circuit provides operating current to attenuators 204 and 208 of the slave mixer. In order to protect the slave mixer against loss of this data in the event that there is an interruption in supply of operating current from the utility service supply to the slave mixer, the slave mixer includes an auxiliary battery-driven power supply circuit 212. A voltage sensitive switch 214 prevents discharge of the battery when the power supply circuit 210 provides operating current, but on interruption of the utility service supply the switch 214 immediately connects the auxiliary power supply circuit 212 to the circuit 206. The circuit 212 provides sufficient current to maintain the circuit 206 in operating condition, i.e., without loss of data stored in the latch and select circuits, when supply of current from the power supply circuit 210 is interrupted, so that when power is restored the gain settings of the input and output attenuators of the slave mixer will be the same as they were before loss of power.

The operation of the mixing system shown in FIG. 8 with respect to connecting the cable between the master and slave circuits and the function of the microprocessor are similar to the equalization system shown in FIG. 5. The slave mixer 194 shown in FIG. 8 can be modified by using a non-volatile random-access memory (RAM) and a microcomputer instead of the auxiliary power supply as described above in relation to FIG. 5. The storage location into which data sets representing the gain settings of the individual attenuators are written is defined by a pointer provided by a thumbwheel switch as it was for equalizing a soundfield.

Figure 9:
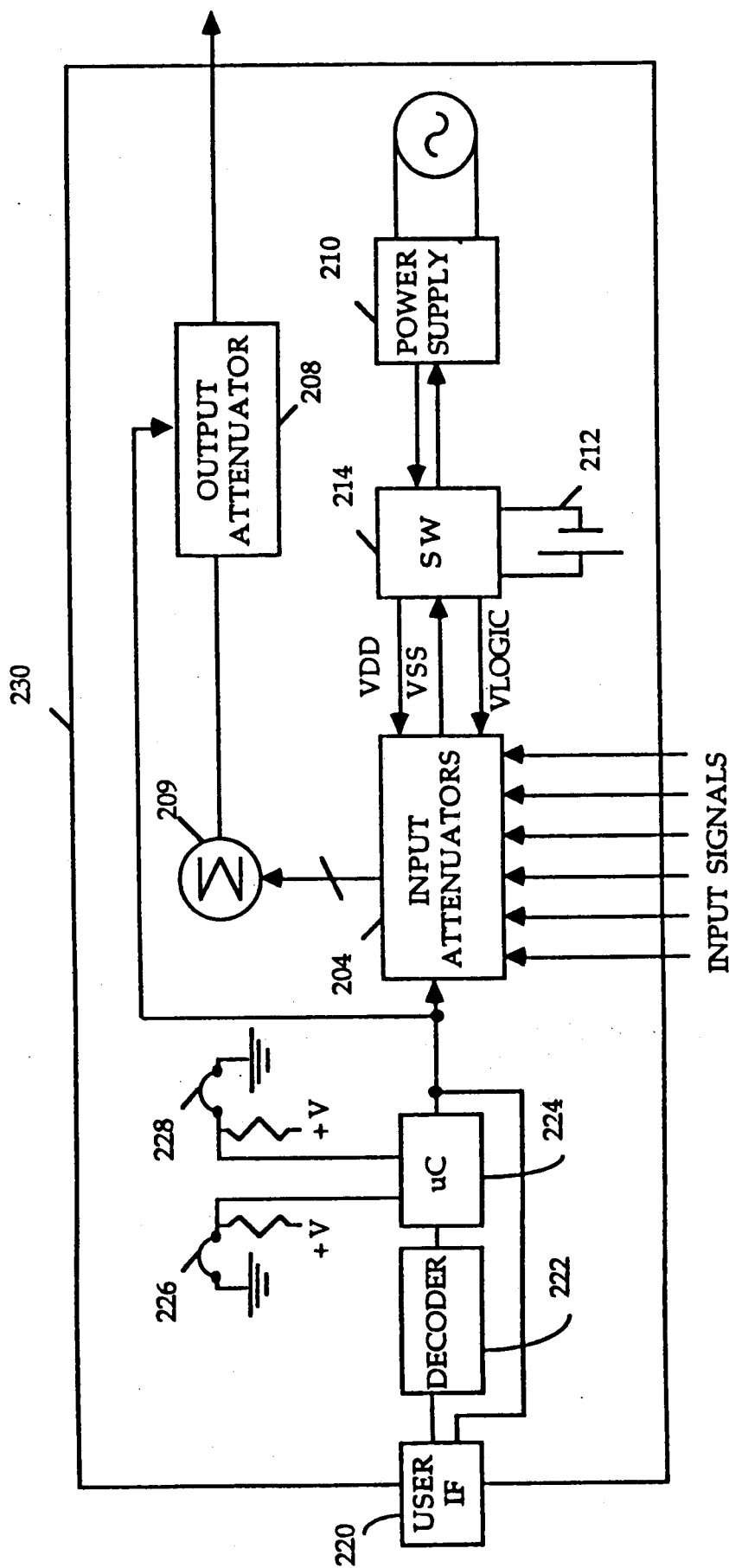
FIG. 9 is a block diagram of a modified mixer.

A modified form of the slave mixer is shown in FIG. 9. In that modification, the slave mixer has a user interface 220 similar to that of master mixer 192, and the user interface is connected through a decoder 222 to a microcomputer 224 for generating data sets. However, removable jumpers 226, 228 connected to pins 232, 234 of microcomputer 224 allow selective disabling of the user interface with respect to the input attenuators and/or the output attenuator. Microcomputer 224 repeatedly polls the state of pins 232, 234. So long as pins 232, 234 are at a low potential level, indicating that the jumpers are connected, microcomputer 224 will respond to signals received from user interface 220 by adjusting the settings of the input attenuators or the setting of the output attenuator as required. However, if jumper 226, for example, is removed, microcomputer 224 will detect that terminal 232 is at a high potential level and will not respond to signals that would affect the settings of the input attenuators although it would still respond to signals for adjusting the setting of the output attenuator. Jumpers 226, 228 are inside the cabinet 230 of the slave mixer and therefore are not accessible to the user of the mixer.

It will be appreciated that the present invention is not restricted to the particular embodiments that have been described and illustrated, and that variations may be made therein without departing from the scope of the invention as defined in the appended claims and equivalents thereof. In particular, the invention is not restricted to use with the National Semiconductor LMC835 integrated circuit, and may be implemented using other programmable resistor networks. The invention is not restricted to use of a master equalizer, such as the equalizer 70 shown in the drawings, for loading data sets into the slave equalizer. For example, data sets may be created by a special-purpose programming instrument or a general-purpose personal computer and entered in the slave equalizer by way of an RS 232 serial data port or a data port employing the MIDI protocol (a standard used for communication between electronic musical instruments). Similarly, a special-purpose programming instrument or a general-purpose personal computer may be used to provide data sets for controlling operation of the slave mixer 194. The invention is not restricted to the data sets being provided to the slave equalizer or slave mixer in serial form, since they may be provided in parallel form and converted to serial form internally of the slave device. Although the LMC835 circuit has only fourteen groups of resistors, an equalizer able to control more than fourteen frequency bands can be provided by use of multiple circuits. Similarly, a mixer embodying the invention is not limited to six input channels. In a practical implementation of an equalizer embodying the invention, a dual channel (left and right stereo) slave equalizer which is capable of controlling 28 bands having their center frequencies at ⅓ octave centers has been constructed. In a simplified form of the slave equalizer 74', the memory 100 has only one storage location and therefore is only able to store data sets defining one frequency response curve. In this case, the microcomputer 102 automatically loads the data sets defining this frequency response curve into the circuit 82 when operating current is received and the cable is not connected to the input port 80. An equalizer embodying the invention is not restricted to being able to store eight sets of data values, representing eight equalization curves, and it may be designed to store a greater or smaller number of sets of data values. A mixer embodying the invention is not restricted to use of attenuators implemented in the manner described with reference to FIG. 7 and by relatively simple modifications the attenuators could each be configured as a boost and cut stage. The invention is not limited to use with a gain control circuit that operates in the frequency domain. U.S. Pat. No. 4,458,362 issued July 3, 1987 (Berkovitz et al) discloses an equalizer that operates in the time domain. The time domain equalizer employs a digital filter, and the frequency response of the equalizer is determined by filter coefficients. In an implementation of the invention with a time domain equalizer, the master equalizer (or other programming instrument) contains a processor for calculating filter coefficients and the slave equalizer contains a non-volatile memory for storing the filter coefficients provided by the master equalizer. The slave equalizer has no front panel controls for selectively altering the filter coefficients, although it may have a switch that allows a person, through use of an access code, to select one of a limited number of sets of filter coefficients.

We claim:

1. Apparatus for compensating an audio signal having a plurality of components, comprising:
    amplifier means for amplifying the components of the audio signal, said amplifier means being selectively adjustable in response to date values received thereby,
    an input port for receiving data values,
    an electronic storage device for storing data values received by way of the input port and applying those data values to the amplifier means, and
    power supply terminals for supplying operating current from an external power source to the electronic storage device,
    the stored data values being maintained in the apparatus upon interruption of the supply of operating current to the power supply terminals, and the apparatus having no controls that can be manually actuated for selectively adjusting the stored data values.

2. Apparatus according to claim 1, wherein said components are frequency components of a single audio input signal, and said amplifier means comprise an amplifier and a gain control circuit for selectively adjusting the frequency response of said amplifier in response to data values received by the amplifier means.

3. Apparatus according to claim 1, having multiple input terminals for receiving multiple audio input signals as the components respectively, said apparatus comprising a summing circuit for mixing the components into a single audio signal.

4. Apparatus according to claim 3, further comprising output amplifier means for receiving the single audio signal, said output amplifier means being selectively adjustable in response to data values received thereby.

5. Apparatus according to claim 4, wherein the output amplifier means comprise an output amplifier and a gain adjustment circuit, the gain adjustment circuit adjusting the amplitude of the single audio signal applied to the output amplifier in response to data values received by the gain adjustment circuit.

6. Apparatus according to claim 5, wherein the gain adjustment circuit is an output attenuator.

7. Apparatus according to claim 1, wherein said amplifier means comprise a plurality of amplifiers for receiving the components respectively and a plurality of gain adjustment circuits associated with the amplifiers, the gain adjustment circuits adjusting the amplitudes of the output signals of the amplifiers in response to data values received by the gain adjustment circuits.

8. Apparatus according to claim 7, wherein each gain adjustment circuit is an attenuator.

9. Apparatus according to claim 1, wherein the electronic storage device comprises a latch and selector circuit and the stored data values are maintained in the storage device upon interruption of the supply of operating current to the power supply terminals by an auxiliary power supply included in the apparatus.

10. Apparatus according to claim 1, wherein the electronic storage device comprises a latch circuit and the stored data values are maintained in the apparatus upon interruption of the supply of operating current to the power supply terminals by a non-volatile memory which is independent of the latch circuit, and the apparatus further comprises means for loading the contents of the non-volatile memory into the latch circuit upon restoration of the supply of operating current to the power supply terminals.

11. Apparatus according to claim 10, wherein the non-volatile memory has a plurality of storage locations, each of which is capable of storing multiple data values, and the apparatus further comprises selector means for selecting one of the storage locations and loading the data values stored at that location into the latch circuit upon restoration of the supply of operating current to the power supply terminals.

12. Apparatus according to claim 11, wherein the non-volatile memory has at least one location for storing an access code and the selector means comprise switch means for entering a code and means for preventing selection of a storage location unless the code entered by way of the switch means matches an access code stored in the non-volatile memory.

13. Apparatus according to claim 1, wherein the electronic storage device comprises a latch circuit and the stored data values are maintained in the apparatus upon interruption of the supply of operating current to the power supply terminals by a non-volatile memory which is independent of the latch circuit, the non-volatile memory having a plurality of storage locations, each of which is capable of storing multiple data values, and the apparatus further comprises selector means for selecting one of the storage locations of the non-volatile memory and loading the contents of the selected storage location into the latch circuit upon restoration of the supply of operating current to the power supply terminals.

14. Apparatus according to claim 13, wherein the non-volatile memory has at least one location for storing an access code and the selector means comprise switch means for entering a code and means for preventing selection of a storage location unless the code entered by way of the switch means matches an access code stored in the non-volatile memory.

15. Apparatus for compensating a plurality of component audio signals, comprising:
amplifier means for amplifying the component signals, said amplifier means being selectively adjustable in response to data values received thereby,
an input port for receiving data values,
an electronic storage device for storing data values received by way of the input port and applying those data values to the amplifier means, and
power supply terminals for supplying operating current from an external power source to the electronic storage device,
the stored data values being maintained in the apparatus upon interruption of the supply of operating current to the power supply terminals, and the apparatus having manually actuable controls and including means for selectively disabling the controls, the controls being operative, when not disabled, to selectively adjust the stored data values.

16. Apparatus according to claim 15, having multiple input terminals for receiving multiple audio input signals as the components respectively, said apparatus comprising summing means for mixing the components into a single audio signal, a master amplifier for receiving the single audio signal, and manually actuable gain control means for selectively adjusting the gain of the master amplifier.

17. Apparatus according to claim 16, wherein the manually actuable gain control means can be selectively disabled.

18. Audio apparatus comprising:
a source of audio signal components,
compensation apparatus comprising, in combination, a first unit and a second unit, the first unit comprising:
amplifier means connected to receive the audio signal components provided by said source and to provide an electrical output signal, said amplifier means being selectively adjustable in response to data values received thereby,
an input port for receiving an electrical signal which is coded in accordance with selected data values for applying the data values to a storage device, and
an electronic storage device for storing data values with which the electrical signal received by way of the input port is encoded, said first unit having no manually actuable means able to selectively adjust the stored data values,
and the second unit comprising:
a device for generating an electrical signal that is coded in accordance with selected data values, and
an output port for making the coded electrical signal generated by said device available at the exterior of the second unit, the output port of the second unit being connectable to the input port of the first unit whereby the second unit may be used to supply the coded electrical signal generated by said device to the input port of the first unit for storage of the selected data values in the electronic storage device of the first unit, the selected data values remaining stored in the electronic storage device when the output port of the second unit is disconnected from the input port of the first unit, and
an electroacoustic transducer connected to receive said electrical output signal provided by the amplifier means and generate an acoustic signal therefrom.

19. Apparatus according to claim 18, wherein said components are frequency components of a single audio input signal, and said amplifier means comprise an amplifier and a gain control circuit for selectively adjusting the frequency response of said amplifier in response to data values received by the amplifier means.

20. Apparatus according to claim 18, having multiple input terminals for receiving multiple audio input signals as the components respectively, said apparatus comprising a summing circuit for mixing the components into a single audio signal.

21. Apparatus according to claim 20, further comprising output amplifier means for receiving the single audio signal, said output amplifier means being selectively adjustable in response to data values received thereby.

22. Apparatus according to claim 21, wherein the output amplifier means comprise an output amplifier and a gain adjustment device, the gain adjustment device adjusting the amplitude of the single audio signal applied to the output amplifier in response to data values received by the gain adjustment device.

23. Apparatus according to claim 22, wherein the gain adjustment device is an output attenuator.

24. Apparatus according to claim 18, wherein said amplifier means comprise a plurality of amplifiers for receiving the components respectively and a plurality of gain adjustment devices associated with the amplifiers, the gain adjustment devices adjusting the amplitudes of the output signals of the amplifiers in response to data values received by the gain adjustment devices.

25. Apparatus according to claim 24, wherein each gain adjustment device is an attenuator.

26. Apparatus according to claim 18, wherein the electronic storage device comprises a latch circuit having power supply terminals and the stored data values are maintained in the apparatus upon interruption of the supply of operating current to said power supply terminals by a non-volatile memory which is independent of the latch circuit, the non-volatile memory having a plurality of storage locations, each of which is capable of storing multiple data values, and the apparatus further comprises selector means for selecting one of the storage locations and loading the data values stored at that location into the latch circuit upon restoration of the supply of operating current to said power supply terminals.

27. Apparatus according to claim 26, wherein the non-volatile memory has at least one location for storing an access code and the selector means comprise switch means for entering a code and means for preventing selection of a storage location unless the code entered by way of the switch means matches an access code stored in the non-volatile memory.

28. Audio apparatus comprising:
a source of audio signal components,
compensation apparatus comprising, in combination, a first unit and a second unit, the first unit comprising:
amplifier means connected to receive the audio signal components provided by said source and to provide an electrical output signal, said amplifier means being selectively adjustable in response to data values received thereby,
an input port for receiving an electrical signal which is coded in accordance with selected data values for applying the data values to a storage device,
an electronic storage device for storing data values with which the electrical signal received by way of the input port is encoded,
manually actuable controls, and
means for selectively disabling the controls, the controls being operative, when not disabled, to selectively adjust the stored data values,
and the second unit comprising:
a device for generating an electrical signal that is coded in accordance with selected data values, and
an output port for making the coded electrical signal generated by said device available at the exterior of the second unit, the output port of the second unit being connectable to the input port of the first unit, whereby the second unit may be used to supply the electrical signal generated by said device to the input port of the first unit for storage of the selected data values in the storage device of the first unit, the selected data values remaining stored in the storage device when the output port of the second unit is disconnected from the input port of the first unit, and
an electroacoustic transducer connected to receive said electrical output signal provided by the amplifier and generate an acoustic signal therefrom.

29. Apparatus according to claim 28, comprising summing means for mixing the components into a single audio signal, a master amplifier for receiving the single audio signal, and manually actuable gain control means for selectively adjusting the gain of the master amplifier.

30. Apparatus according to claim 29, wherein the manually actuable gain control means can be selectively disabled.

* * * * *

UNITED STATES PATENT AND TRADEMARK OFFICE
CERTIFICATE OF CORRECTION

PATENT NO. : 5,022,083
DATED : June 4, 1991
INVENTOR(S) : EUGENE RIMKEIT et al It is certified that error appears in the above-identified patent and that said Letters Patent is hereby corrected as shown below:

Column 2, line 33, after "$f_1$" insert a period (.).

Column 12, line 22, "date" should be --data--.

Signed and Sealed this

Twentieth Day of October, 1992

Attest:

DOUGLAS B. COMER

Attesting Officer      Acting Commissioner of Patents and Trademarks